(12) United States Patent  
Yokoyama et al.

(10) Patent No.: US 11,710,644 B2
(45) Date of Patent: Jul. 25, 2023

(54) ETCHING METHOD AND PLASMA PROCESSING APPARATUS (71) Applicant: Tokyo Electron Limited, Tokyo (JP)

(72) Inventors: Takahiro Yokoyama, Miyagi (JP); Taihei Matsuhashi, Miyagi (JP); Masanori Hosoya, Miyagi (JP); Hiroie Matsumoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/488,322

(22) Filed: Sep. 29, 2021

(65) Prior Publication Data

US 2022/0102159 A1 Mar. 31, 2022

(30) Foreign Application Priority Data

Sep. 29, 2020 (JP) .................................. 2020-163637

(51) Int. Cl.
*H01L 21/311* (2006.01)
*H01L 21/3065* (2006.01)
*H01J 37/32* (2006.01)

(52) U.S. Cl.
CPC .. *H01L 21/31116* (2013.01); *H01J 37/32449* (2013.01); *H01J 37/32724* (2013.01); *H01L 21/3065* (2013.01); *H01L 21/31144* (2013.01); *H01J 2237/334* (2013.01)

(58) Field of Classification Search
None
See application file for complete search history.

(56) References Cited

U.S. PATENT DOCUMENTS

2019/0378724 A1* 12/2019 Toda ................. H01L 21/31116
2020/0066540 A1* 2/2020 Hudson ............. H01L 21/31116

FOREIGN PATENT DOCUMENTS

JP 2010-041028 A 2/2010

* cited by examiner

*Primary Examiner* — Roberts P Culbert
(74) *Attorney, Agent, or Firm* — Xsensus LLP

(57) ABSTRACT

An etching method includes: (a) providing a substrate including a silicon-containing film on a substrate support; (b) adjusting a temperature of the substrate support to −20° C. or lower; (c) supplying a processing gas including a nitrogen-containing gas, into the chamber; (d) etching the silicon-containing film by using plasma generated from the processing gas. A recess is formed by etching the silicon-containing film, and a by-product containing silicon and nitrogen adheres to a side wall of the recess. The etching method further includes (e) setting at least one etching parameter of the temperature of the substrate support and the flow rate of the nitrogen-containing gas included in the processing gas, to adjust the width of the bottom of the recess according to an adhesion amount of the by-product, before (b).

17 Claims, 9 Drawing Sheets

ETCHING METHOD AND PLASMA PROCESSING APPARATUS

CROSS-REFERENCE TO RELATED APPLICATION

This application is based on and claims priority from Japanese Patent Application No. 2020-163637, filed on Sep. 29, 2020, with the Japan Patent Office, the disclosure of which is incorporated herein in its entirety by reference.

TECHNICAL FIELD

The present disclosure relates to an etching method and a plasma processing apparatus.

BACKGROUND

Japanese Patent Laid-Open Publication No. 2010-041028 discloses a substrate processing method. A processing target layer, an intermediate layer, and a mask layer are stacked on a substrate in this order, and the mask layer has an opening for exposing a portion of the intermediate layer. Deposits are deposited on the side wall surface of the opening of the mask layer by plasma generated from a deposition gas with a gas attachment coefficient S of 0.1 to 1.0. Accordingly, the opening width of the opening is narrowed.

SUMMARY

According to an aspect of the present disclosure, an etching method includes: (a) providing a substrate including a silicon-containing film on a substrate support in a chamber of a plasma processing apparatus; (b) adjusting a temperature of the substrate support to −20° C. or lower; (c) supplying a processing gas including a nitrogen-containing gas, into the chamber; (d) etching the silicon-containing film by using plasma generated from the processing gas, so that a recess is formed, and a by-product containing silicon and nitrogen adheres to a side wall of the recess; and (e) before (b), setting at least one etching parameter of the temperature of the substrate support and a flow rate of the nitrogen-containing gas included in the processing gas, to adjust a width of a bottom of the recess according to an adhesion amount of the by-product.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described.

An embodiment of the present disclosure provides an etching method. The etching method includes (a) providing a substrate on a substrate support in a chamber of a plasma processing apparatus. The substrate includes a silicon-containing film. The etching method includes (b) adjusting the temperature of the substrate support to −20° C. or lower. The etching method includes (c) supplying a processing gas including a nitrogen-containing gas, into the chamber. The etching method includes (d) etching the silicon-containing film by using plasma generated from the processing gas. By etching the silicon-containing film, a recess is formed, and by etching the silicon-containing film, a by-product containing silicon and nitrogen adheres to the side wall of the recess. The etching method includes (e) setting at least one etching parameter of the temperature of the substrate support and the flow rate of the nitrogen-containing gas included in the processing gas, so as to adjust the width of the bottom of the recess according to an adhesion amount of the by-product, before (b).

According to the etching method of the embodiment above, the amount of the by-product adhering to the side wall of the recess may be adjusted by changing a setting value of at least one etching parameter of the temperature of the substrate support and the flow rate of the nitrogen-containing gas. As a result, the width of the bottom of the recess may also be adjusted. For example, when the temperature of the substrate support is increased, the volatilization of the by-product is accelerated, and thus, the amount of the by-product adhering to the side wall of the recess decreases. As a result, the width of the bottom of the recess is widened. Meanwhile, when the temperature of the substrate support is decreased, the volatilization of the by-product is suppressed, and thus, the amount of the by-product adhering to the side wall of the recess increases. As a result, the width of the bottom of the recess is narrowed. Further, since the by-product contains nitrogen, the amount of the by-product adhering to the side wall of the recess increases when the flow rate of the nitrogen-containing gas in the processing gas is increased. As a result, the width of the bottom of the recess is narrowed. Meanwhile, when the flow rate of the nitrogen-containing gas is decreased, the amount of the by-product adhering the side wall of the recess decreases. As a result, the width of the bottom of the recess is widened. Thus, according to the etching method, in the plasma etching of the silicon-containing film, the width of the bottom of the recess formed by the etching may be adjusted.

The setting value of the at least one etching parameter may be determined by using the correlation between the width of the bottom of the recess and the at least one etching parameter.

A setting value of the temperature of the substrate support may be determined by using the correlation. In this case, by adjusting the temperature of the substrate support, a recess with the bottom having a desired width may be formed.

A setting value of the flow rate of the nitrogen-containing gas may be determined by using the correlation. In this case, by adjusting the flow rate of the nitrogen-containing gas, a recess with the bottom having a desired width may be formed.

The etching method of the embodiment above may further include (f) etching a film included in the substrate by using the silicon-containing film in which the recess is formed. In this case, the film is etched by using the silicon-containing film as a mask.

In (f), the film may be etched at a temperature lower than the volatilization temperature of the by-product. In this case, when the film is etched in (f), the volatilization of the by-product adhering onto the side wall that defines the recess of the silicon-containing film may be suppressed. Thus, the width of the bottom of the recess of the silicon-containing film is hard to change, so that the width of the recess formed in the film is also hard to change.

The substrate may further include a mask that has an opening on the silicon-containing film. The etching method of the embodiment described above may further include (g) measuring an opening width of the mask, before (a). The etching method may further include (h) comparing a measured value of the opening width of the mask with a setting value of the opening width of the mask. The etching method may further include (i) calculating a difference between the measured value and the setting value when the measured value exceeds the setting value. The etching method may further include determining the setting value of the at least one etching parameter based on the difference. In this case, the width of the bottom of the recess may be made close to a target value.

The silicon-containing film may be an antireflection film.

The aspect ratio of the recess may be 5 or less.

The nitrogen-containing gas may include at least one of $N_2$, $NF_3$, and $NH_3$.

The processing gas may include carbon and fluorine.

The processing gas may include at least one of a gas mixture of hydrocarbon gas and a fluorine-containing gas, fluorocarbon gas, and hydrofluorocarbon gas.

Another embodiment of the present disclosure provides an etching method. The etching method includes (a) providing a substrate on a substrate support in a chamber of a plasma processing apparatus. The substrate includes a film containing silicon and nitrogen. The etching method includes (b) adjusting the temperature of the substrate support to −20° C. or lower. The etching method includes (c) supplying a processing gas including hydrogen and fluorine, into the chamber. The etching method includes (d) etching the film containing silicon and nitrogen by using plasma generated from the processing gas. By etching the film containing silicon and nitrogen, a recess is formed, and by etching the film containing silicon and nitrogen, a by-product containing silicon and nitrogen adheres to the side wall of the recess. The etching method includes (e) setting the temperature of the substrate support to adjust the width of the bottom of the recess according to an adhesion amount of the by-product, before (b).

According to the etching method of the embodiment above, the adhesion amount of the by-product may be adjusted by changing the temperature of the substrate support. As a result, the width of the bottom of the recess may also be adjusted. For example, when the temperature of the substrate support is increased, the volatilization of the by-product is accelerated, and thus, the amount of the by-product adhering to the side wall of the recess decreases. As a result, the width of the bottom of the recess is widened. Meanwhile, when the temperature of the substrate support is decreased, the volatilization of the by-product is suppressed, and thus, the amount of the by-product adhering to the side wall of the recess increases. As a result, the width of the bottom of the recess is narrowed. Thus, according to the etching method, in the plasma etching of the silicon-containing film, the width of the bottom of the recess formed by the etching may be adjusted.

Yet another embodiment of the present disclosure provides a plasma processing apparatus. The plasma processing apparatus includes a chamber. The plasma processing apparatus includes a substrate support that supports a substrate in the chamber. The substrate includes a silicon-containing film. The plasma processing apparatus includes a gas supply configured to supply a processing gas that is used for etching the silicon-containing film and includes a nitrogen-containing gas, into the chamber. The plasma processing apparatus includes a plasma generator configured to generate plasma from the processing gas in the chamber. The plasma processing apparatus includes a controller. The controller is configured to adjust the temperature of the substrate support to −20° C. or lower. The controller is configured to control at least one of the substrate support and the gas supply such that at least one etching parameter of the temperature of the substrate support and the flow rate of the nitrogen-containing gas included in the processing gas becomes a setting value. A by-product containing silicon and nitrogen is produced by etching the silicon-containing film, and adheres to the side wall of a recess formed by etching the silicon-containing film. The setting value is set so as to adjust the width of the bottom of the recess according to the adhesion amount of the by-product.

According to the plasma processing apparatus of the embodiment above, the amount of the by-product adhering to the side wall of the recess may be adjusted by changing a setting value of at least one etching parameter of the temperature of the substrate support and the flow rate of the nitrogen-containing gas. As a result, the width of the bottom of the recess may also be adjusted. Thus, in the plasma etching of the silicon-containing film, the width of the bottom of the recess formed by the etching may be adjusted.

The substrate support has a plurality of regions, and the plurality of regions may be heated to different temperatures. In this case, the width of the bottom of the recess formed in the silicon-containing film may be formed to be different for each region of the substrate.

The plasma processing apparatus of the embodiment above may further include an observation device for observing the substrate. In this case, for example, the observation device may observe the shape of the recess to measure the width of the bottom of the recess.

Hereinafter, the various embodiments of the present disclosure will be described in detail with reference to the drawings. In the respective drawings, similar or corresponding portions will be denoted by the same reference numerals.

Figure 1:
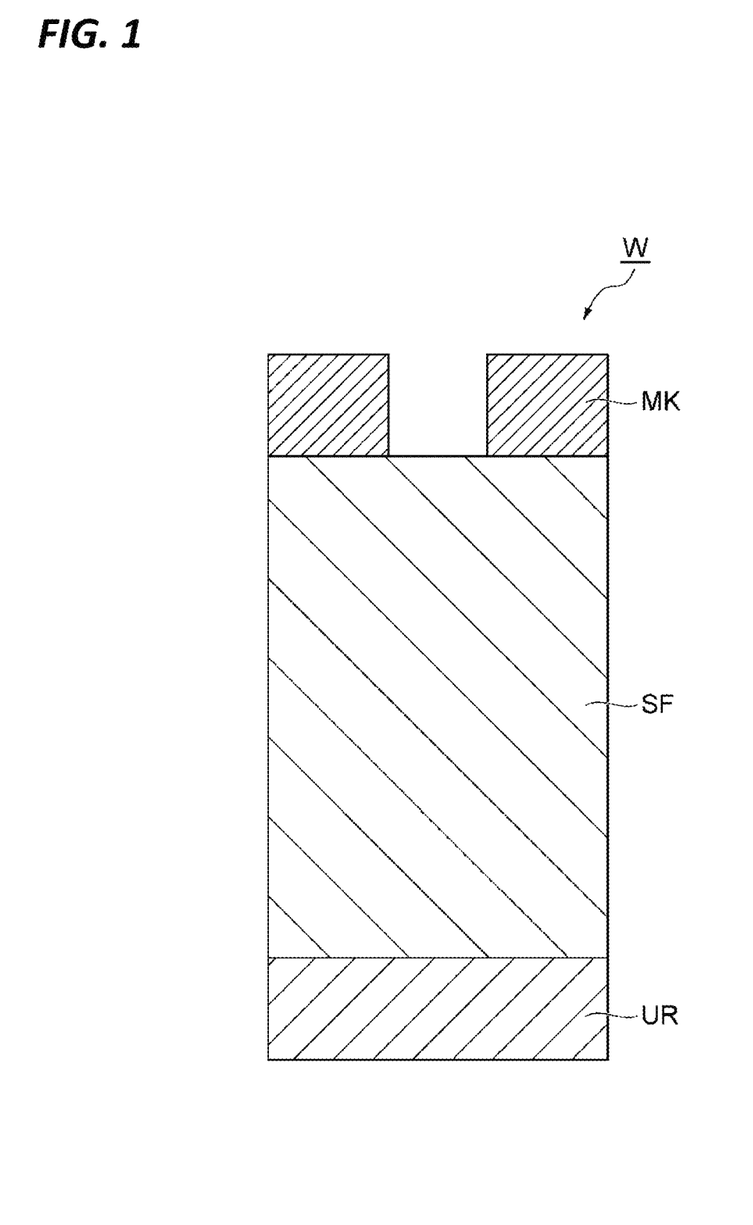
FIG. 1 is a partially enlarged cross-sectional view of an example of a substrate to which an etching method according to an embodiment is applicable.

FIG. 1 is a partially enlarged cross-sectional view of an example of a substrate to which an etching method according to an embodiment is applicable. A substrate W includes a silicon-containing film SF. The silicon-containing film SF may be a film containing silicon and nitrogen. The silicon-containing film SF may be an antireflection film. The silicon-containing film SF may be a silicon-containing dielectric film. The silicon-containing dielectric film may include a silicon oxide film or a silicon nitride film. The silicon-containing dielectric film may be any other types of films that contain silicon. Further, the silicon-containing film SF may include a silicon film (e.g., a polycrystalline silicon film). Further, the silicon-containing film SF may include two or more silicon-containing films that have different types of films. The two or more silicon-containing films may include a silicon oxide film and a silicon nitride film. The silicon-containing film SF may be, for example, a multilayer film that includes one or more silicon oxide films and one or more silicon nitride films which are alternately stacked. Further, the two or more silicon-containing films may include a silicon oxide film and a silicon film. The silicon-containing film SF may be, for example, a multilayer film that includes one or more silicon oxide films and one or more silicon films which are alternately stacked. Further, the two or more silicon-containing films may include a silicon oxide film, a silicon nitride film, and a silicon film.

The substrate W may further include a film UR as a base region. The silicon-containing film SF may be formed on the film UR. The film UR is formed of a material having an etching rate higher than the etching rate of the silicon-containing film SF. The film UR may be an organic film.

The substrate W may further include a mask MK. The mask MK is provided on the silicon-containing film SF. The mask MK is formed of a material having an etching rate lower than the etching rate of the silicon-containing film SF. The mask MK may be formed of an organic material. The mask MK may be formed of, for example, an amorphous carbon film, a photoresist film, or a spin-on carbon (SOC) film. Further, the mask MK may be a metal-containing mask which is formed of a metal-containing material such as titanium nitride, tungsten, or tungsten carbide. The mask MK may have a thickness of 100 nm or less.

The mask MK is patterned. That is, the mask MK has a pattern to be transferred to the silicon-containing film SF. When the pattern of the mask MK is transferred to the silicon-containing film SF, an opening such as a hole or a trench is formed in the silicon-containing film SF.

Figure 2:
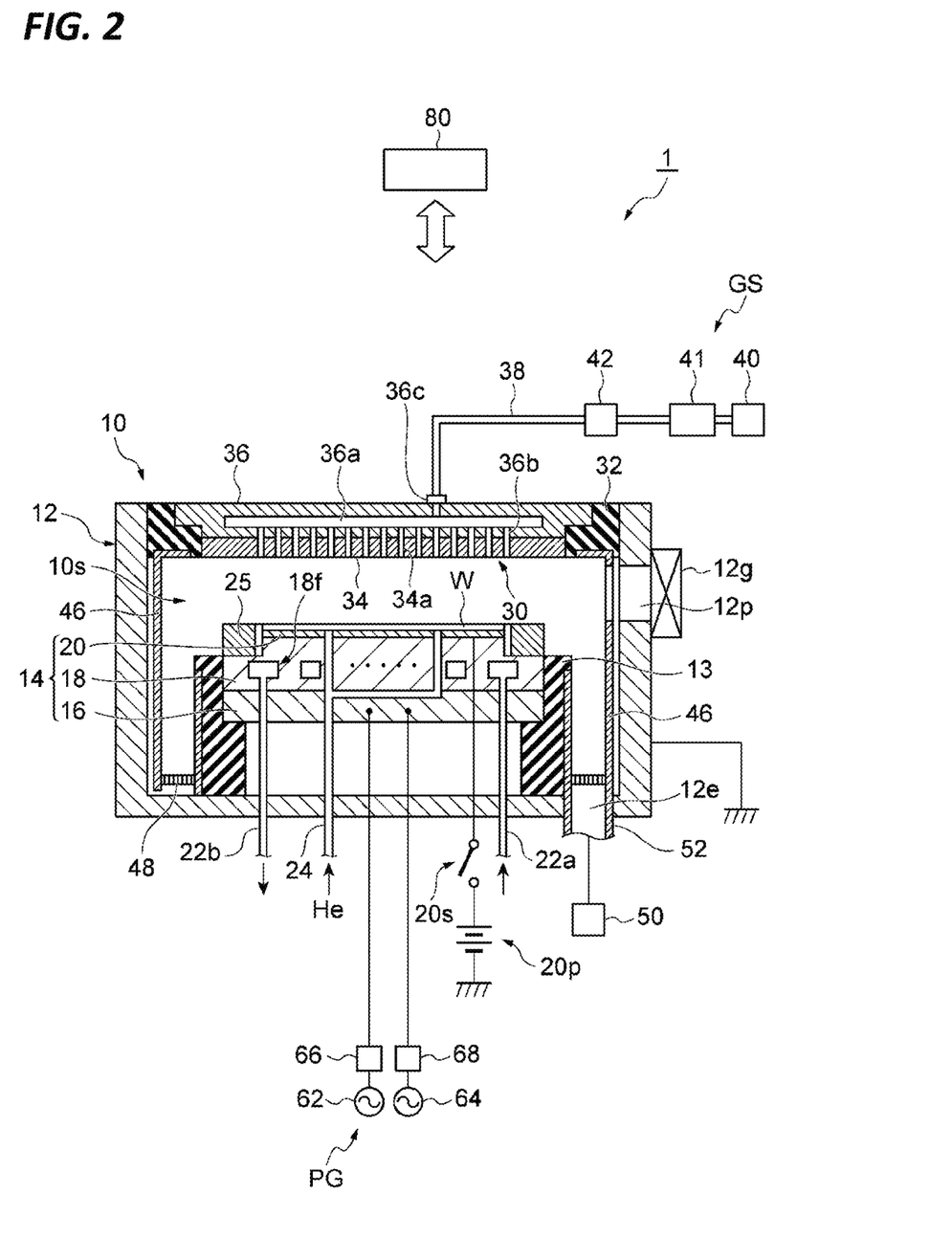
FIG. 2 is a view schematically illustrating a plasma processing apparatus according to an embodiment.

FIG. 2 is a view schematically illustrating a plasma processing apparatus according to an embodiment. As illustrated in FIG. 2, a plasma processing apparatus 1 includes a container 10. The chamber 10 provides an internal space 10s therein. The chamber 10 includes a chamber body 12. The chamber body 12 has a substantially cylindrical shape. The chamber body 12 is formed of, for example, aluminum. A corrosion-resistant film is provided on the inner wall surface of the chamber body 12. The corrosion-resistant film may be formed of ceramic such as aluminum oxide or yttrium oxide.

A passage 12p is formed in the side wall of the chamber body 12. The substrate W is transferred between the internal space 10s and the outside of the chamber 10 through the passage 12p. The passage 12p is opened and closed by a gate valve 12g. The gate valve 12g is provided along the side wall of the chamber body 12.

A support 13 is provided on the bottom of the chamber body 12. The support 13 is formed of an insulating material. The support 13 has a substantially cylindrical shape. The support 13 extends upward from the bottom of the chamber body 12 inside the inner space 10s. The support 13 supports the substrate support 14. The substrate support 14 is configured to support the substrate W inside the internal space 10s.

The substrate support 14 includes a lower electrode 18 and an electrostatic chuck 20. The substrate support 14 may further include an electrode plate 16. The electrode plate 16 is formed of a conductor such as aluminum, and has a substantially disc shape. The lower electrode 18 is provided on the electrode plate 16. The lower electrode 18 is formed of a conductor such as aluminum, and has a substantially disc shape. The lower electrode 18 is electrically connected to the electrode plate 16.

The electrostatic chuck 20 is provided on the lower electrode 18. The substrate W is placed on the upper surface of the electrostatic chuck 20. The electrostatic chuck 20 may include one or more heaters for heating the substrate W. The electrostatic chuck 20 includes a main body and an electrode. The main body of the electrostatic chuck 20 has a substantially disc shape, and is formed of a dielectric. The electrode of the electrostatic chuck 20 is a film-shaped electrode, and is provided in the main body of the electrostatic chuck 20. The electrode of the electrostatic chuck 20 is connected to a DC power supply 20p via a switch 20s. When a voltage from the DC power supply 20p is applied to the electrode of the electrostatic chuck 20, an electrostatic attractive force is generated between the electrostatic chuck 20 and the substrate W. The substrate W is attracted to the electrostatic chuck 20 by the electrostatic attractive force, and held by the electrostatic chuck 20.

An edge ring 25 is disposed on the substrate support 14. The edge ring 25 is a ring-shaped member. The edge ring 25 may be formed of, for example, silicon, silicon carbide, or quartz. The substrate W is placed in the region surrounded by the edge ring 25 on the electrostatic chuck 20.

A flow path 18f is formed inside the lower electrode 18. A heat exchange medium (e.g., a coolant) is supplied to the flow path 18f from a chiller unit provided outside the chamber body 10 through a pipe 22a. The heat exchange medium supplied to the flow path 18f is returned to the chiller unit through a pipe 22b. In the plasma processing apparatus 1, the temperature of the substrate W placed on the electrostatic chuck 20 is adjusted by the heat exchange between the heat exchange medium and the lower electrode 18.

A gas supply line 24 is provided in the plasma processing apparatus 1. The gas supply line 24 supplies a heat transfer gas (e.g., He gas) from a heat transfer gas supply mechanism to the space between the upper surface of the electrostatic chuck 20 and the rear surface of the substrate W.

The plasma processing apparatus 1 further includes an upper electrode 30. The upper electrode 30 is provided above the substrate support 14. The upper electrode 30 is supported in the upper portion of the chamber body 12 via a member 32. The member 32 is formed of a material having an insulating property. The upper electrode 30 and the member 32 close the upper opening of the chamber body 12.

The upper electrode 30 may include a top plate 34 and a support 36. The lower surface of the top plate 34 faces the internal space 10s, and defines the internal space 10s. The top plate 34 may be formed of a low-resistance conductor or semiconductor that generates less Joule heat. The top plate 34 includes a plurality of gas ejection holes 34a that penetrates the top plate 34 in the plate thickness direction of the top plate 34.

The support 36 detachably supports the top plate 34. The support 36 may be formed of a conductive material such as aluminum. A gas diffusion chamber 36a is provided inside the support 36. The support 36 includes a plurality of gas holes 36b that extends downward from the gas diffusion chamber 36a. The plurality of gas holes 36b communicate with the plurality of gas ejection holes 34a, respectively. A gas inlet port 36c is formed in the support 36. The gas inlet port 36c is connected to the gas diffusion chamber 36a. A gas supply pipe 38 is connected to the gas inlet port 36c.

A gas source group 40 is connected to the gas supply pipe 38 via a flow rate controller group 41 and a valve group 42. The flow rate controller group 41 and the valve group 42 make up a gas supply GS. The gas supply GS may further include the gas source group 40. The gas source group 40 includes a plurality of gas sources. The plurality of gas sources include sources of the plurality of gases included in the processing gas. The flow rate controller group 41 includes a plurality of flow rate controllers. Each of the plurality of flow rate controllers in the flow controller group 41 is a mass flow controller or a pressure control type of flow rate controller. The valve group 42 includes a plurality of opening/closing valves. Each of the plurality of gas sources in the gas source group 40 is connected to the gas supply pipe 38 via a corresponding flow rate controller of the flow rate controller group 41 and a corresponding opening/closing valve of the valve group 41.

In the plasma processing apparatus 1, a shield 46 is detachably provided along the inner wall surface of the chamber body 12 and the outer periphery of the support 13. The shield 46 prevents a reaction by-product from adhering to the chamber body 12. The shield 46 is configured by forming a corrosion-resistant film on the surface of a base member made of, for example, aluminum. The corrosion-resistant film may be formed of a ceramic such as yttrium oxide.

A baffle plate 48 is provided between the support 13 and the side wall of the chamber body 12. The baffle plate 48 is configured by forming a corrosion-resistant film (e.g., yttrium oxide film) on the surface of a member made of, for example, aluminum. A plurality of through holes is formed in the baffle plate 48. An exhaust port 12e is formed in the bottom of the chamber body 12 below the baffle plate 48. An exhaust device 50 is connected to the exhaust port 12e via an exhaust pipe 52. The exhaust device 50 includes a pressure regulation valve and a vacuum pump such as a turbo molecular pump.

The plasma processing apparatus 1 includes a first radio-frequency power supply 62 and a second radio-frequency power supply 64. The first radio-frequency power supply 62 generates a first radio-frequency power. The first radio-frequency power has a frequency suitable for generating plasma. The frequency of the first radio-frequency power falls in a range of, for example, 27 MHz to 100 MHz. The first radio-frequency power supply 62 is connected to the lower electrode 18 via a matching unit 66 and the electrode plate 16. The matching unit 66 includes a circuit for matching the output impedance of the first radio-frequency power supply 62 and the impedance of a load side (the lower electrode 18) with each other. Further, the first radio-frequency power supply 62 may be connected to the upper electrode 30 via the matching unit 66. The first radio-frequency power supply 62 is an example of a plasma generator PG.

The second radio-frequency power supply 64 generates a second radio-frequency power. The second radio-frequency power has a frequency lower than the frequency of the first radio-frequency power. In a case where the second radio-frequency power is used together with the first radio-frequency power, the second radio-frequency power is used as a bias radio-frequency power for drawing ions into the substrate W. The frequency of the second radio-frequency power falls in a range of, for example, 400 kHz to 13.56 MHz. The second radio-frequency power supply 64 is connected to the lower electrode 18 via the matching unit 68 and the electrode plate 16. The matching device 68 includes a circuit for matching the output impedance of the second radio-frequency power supply 64 and the impedance of a load side (the lower electrode 18) with each other.

Further, plasma may be generated by using the second radio-frequency power without using the first radio-frequency power, that is, by using only a single radio-frequency power. In this case, the frequency of the second radio-frequency power may be larger than 13.56 MHz, and may be, for example, 40 MHz. Further, in this case, the plasma processing apparatus 1 may not include the first ratio-frequency power supply 62 and the matching device 66. In this case, the second radio-frequency power supply 64 is an example of the plasma generator PG.

When a plasma processing is performed in the plasma processing apparatus 1, the processing gas is supplied from the gas supply GS into the internal space 10s. The gas supply GS is configured to supply the processing gas for etching the silicon-containing film SF into the chamber 10. Further, when the first radio-frequency power and/or the second radio-frequency power are supplied, a radio-frequency electric field is generated between the upper electrode 30 and the lower electrode 18. The generated radio-frequency electric field generates plasma from the processing gas in the internal space 10s. The plasma generator PG is configured to generate the plasma from the processing gas in the chamber 10.

The plasma processing apparatus 1 may further include a controller 80. The controller 80 may be a computer that includes a processor, a storage unit such as a memory, an input device, a display device, and a signal input/output interface. The controller 80 controls the respective units of the plasma processing apparatus 1 such that the etching parameters such as, for example, the temperature of the substrate support 14, the flow rate of each gas included in the processing gas, the pressure in the chamber 10, and the radio-frequency power become setting values. In the controller 80, an operator may perform, for example, a command inputting operation by using the input device, in order to manage the plasma processing apparatus 1. Further, in the controller 80, the display device may visualize and display an operation status of the plasma processing apparatus 1. Further, the storage unit stores a control program and recipe data. The recipe data includes the setting values of the etching parameters. The control program is executed by the processor in order to execute various processes in the plasma processing apparatus 1. The processor executes the control program to control each unit of the plasma processing apparatus 1 according to the recipe data.

Figure 3:
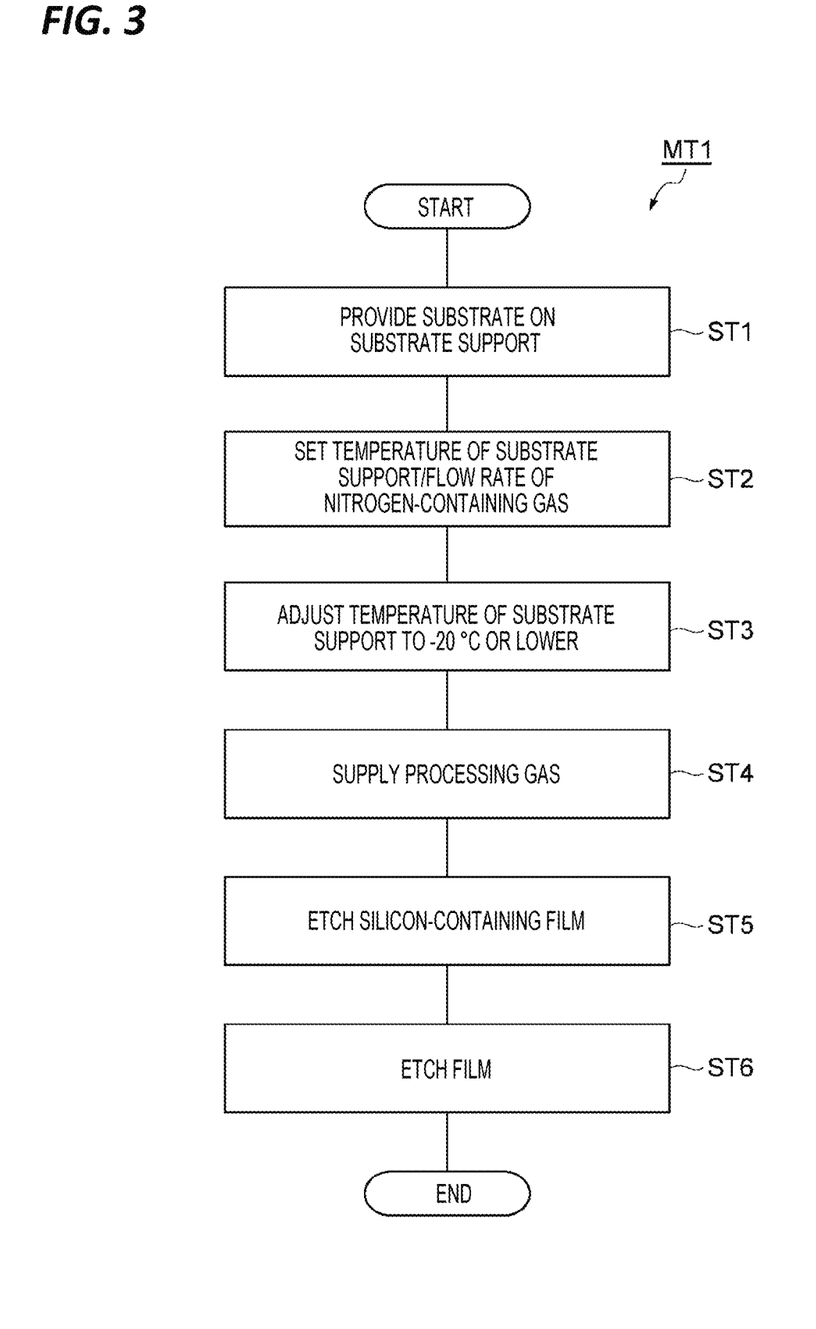
FIG. 3 is a flowchart of an etching method according to an embodiment.
Figure 4A:
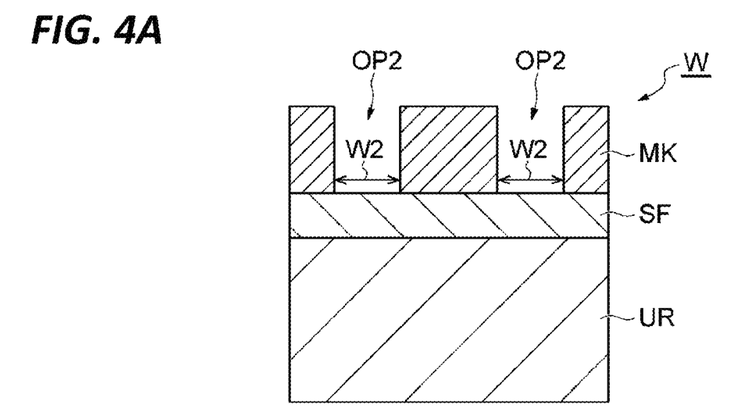
FIGS. 4A to 4C are partially enlarged cross-sectional views of an example of a substrate to which the etching method illustrated in FIG. 3 is applied.
Figure 4B:
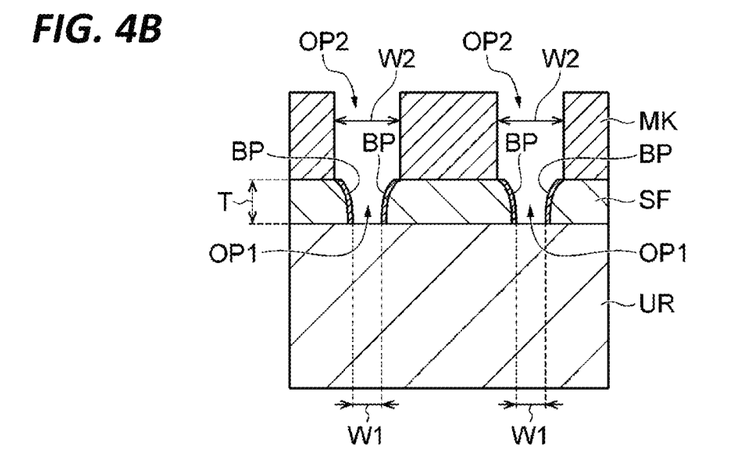
Figure 4C:
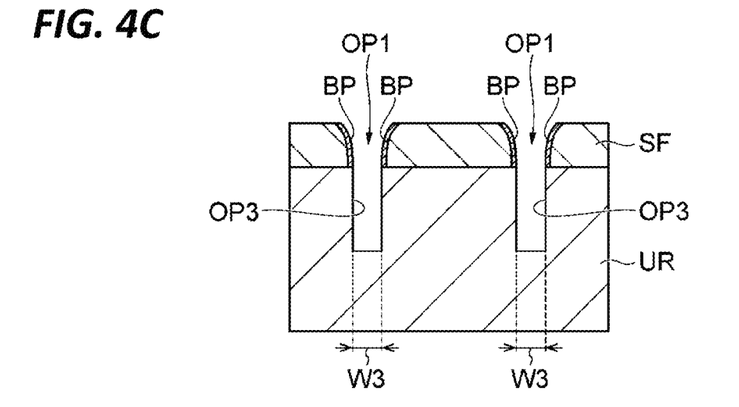

FIG. 3 is a flowchart of an etching method according to an embodiment. The etching method illustrated in FIG. 3 (hereinafter, referred to as a "method MT1") may be executed by the plasma processing apparatus 1. The method MT1 is applied to the substrate W. The method MT1 includes steps ST1 to ST5. Steps ST1 to ST5 are executed in this order. Step ST2 may be executed simultaneously with step ST1 or may be executed before step ST1. FIGS. 4A to 4C are partially enlarged cross-sectional views of an example of a substrate to which the etching method illustrated in FIG. 3 is applied.

Hereinafter, the method MT1 will be described assuming a case where the method MT1 is applied to the substrate W by using the plasma processing apparatus 1, as an example. When the plasma processing apparatus 1 is used, the method MT1 may be executed in the plasma processing apparatus 1 by the control of each unit of the plasma processing apparatus 1 by the controller 80.

In step ST1, the substrate W is provided on the substrate support 14 in the chamber 10 of the plasma processing apparatus 1. As illustrated in FIG. 4A, the substrate W may include the film UR, the silicon-containing film SF provided on the film UR, and the mask MK provided on the silicon-containing film SF. An opening OP2 is formed in the mask MK. The opening OP2 is, for example, a hole or a trench. The opening OP2 has a width W2. The substrate W is placed on the electrostatic chuck 20 in the chamber 10, and held by the electrostatic chuck 20. The substrate W may have a diameter of 300 mm.

In step ST3, the temperature of the substrate support 14 is adjusted to −20° C. or lower. The temperature of the substrate support 14 may be decreased using a chiller unit.

In step ST4, a processing gas is supplied into the chamber 10. The processing gas is supplied from the gas supply GS. The processing gas may include a nitrogen-containing gas. When the silicon-containing film SF contains nitrogen, the processing gas may not include the nitrogen-containing gas. The nitrogen-containing gas may include at least one of $N_2$, $NF_3$, and $NH_3$.

The processing gas may include hydrogen and fluorine. The processing gas may include carbon and fluorine. The processing gas may include at least one of a gas mixture of hydrocarbon ($C_xH_y$) gas and a fluorine-containing gas, fluorocarbon gas, and hydrofluorocarbon ($CH_xF_y$) gas. Here, each of "x" and "y" is a natural number. Hydrocarbon is, for example, $CH_4$ or $C_3H_6$. Fluorocarbon is, for example, at least one of $CF_4$, $C_3F_8$, $C_4F_6$, and $C_4F_8$. Hydrofluorocarbon is, for example, at least one of $CH_2F_2$, $CHF_3$, and $CH_3F$. The processing gas may include at least one of $H_2$, hydrogen fluoride (HF), hydrocarbon, hydrofluorocarbon, and $NH_3$ as a molecule containing hydrogen. The processing gas may further include oxygen. The processing gas may include, for example, $O_2$.

In step ST5, the silicon-containing film SF is etched using plasma generated from the processing gas supplied into the chamber 10.

In step ST4, the controller 80 controls the gas supply GS to supply the processing gas into the chamber 10. The controller 80 controls the gas supply GS such that the flow rate of each gas included in the processing gas becomes a setting value. In step ST3, the controller 80 controls the substrate support 14 such that the temperature of the substrate support 14 (e.g., the temperature of a heater in the electrostatic chuck 20) becomes a setting value of −20° C. or lower. Prior to step ST5, the controller 80 controls the exhaust device 50 such that the pressure of the gas in the chamber 10 becomes a setting value. In step ST5, the controller 80 controls the first radio-frequency power supply 62 and the second radio-frequency power supply 64 such that the supplied first radio-frequency power and/or second radio-frequency power become setting values.

In step ST5, as illustrated in FIG. 4B, the silicon-containing film SF is etched, so that a recess OP1 is formed in the silicon-containing film SF. The recess OP1 corresponds to the opening OP2. When the silicon-containing film SF is etched, a by-product BP containing silicon and nitrogen is produced. The by-product BP may be a film that adheres to the side wall of the recess OP1. The by-product BP may include ammonium silicate such as ammonium silicofluoride (($NH_4)_2SiF_6$).

The opening OP1 is, for example, a hole or a trench. The bottom of the opening OP1 has a width W1. The width W1 may be smaller than the width W2 of the opening OP2, and may be half or less of the width W2. The width W1 may be 20 nm or less. The recess OP1 may have the same width as the width W2 of the mask MK at the upper end of the recess OP1. The recess OP1 may have a tapered shape in which the width gradually decreases from the upper end toward the lower end of the recess OP1. The aspect ratio of the recess OP1 may be 5 or less. The aspect ratio (T/W2) is the depth T of the recess OP1 with respect to the width of the recess OP1 at the upper end of the recess OP1 (identical to the width W2).

In step ST2, at least one etching parameter of the temperature of the substrate support 14 and the flow rate of the nitrogen-containing gas included in the processing gas is set to adjust the width W1 of the bottom of the recess OP1 according to the adhesion amount of the by-product BP. The at least one etching parameter will also be referred to as an etching parameter PTF hereinafter. For example, the operator inputs the setting value of the etching parameter PTF to the controller 80 of the plasma processing apparatus 1. The setting value of the etching parameter PTF may be determined by using the correlation between the width W1 of the bottom of the recess OP1 and the etching parameter PTF. Assuming that the value of the etching parameter PTF is "x," and the value of the width W1 of the recess OP1 is "y," "y" is a function of "x." That is, the relationship of y=f(x) is satisfied. When the target value y1 of the width W1 of the bottom of the recess OP1 is substituted into y=f(x), a setting value x1 of the etching parameter PTF is obtained. This relationship and the data of each value may be stored in the storage unit of the controller 80. The setting value of the etching parameter PTF is determined by the controller 80.

When the etching parameter PTF is the temperature of the substrate support 14, the setting value of the temperature of the substrate support 14 may be determined by using the correlation between the width W1 of the bottom of the recess OP1 and the temperature of the substrate support 14. The correlation may be a correlation in which the width W1 of the bottom of the recess OP1 monotonically increases as the temperature of the substrate support 14 increases. The setting value of the temperature of the substrate support 14 may be −20° C. or lower, −30° C. or lower, or −35° C. or lower.

When the etching parameter PTF is the flow rate of the nitrogen-containing gas, the setting value of the flow rate of the nitrogen-containing gas may be determined by using the correlation between the width W1 of the bottom of the recess OP1 and the flow rate of the nitrogen-containing gas. The correlation may be a correlation in which the width W1 of the bottom of the recess OP1 monotonically decreases as the flow rate of the nitrogen-containing gas increases. The setting value of the flow rate of the nitrogen-containing gas may be 5 sccm or more or 20 sccm or less.

When the etching parameter PTF is both the temperature of the substrate support 14 and the flow rate of the nitrogen-containing gas, the setting value of the temperature of the substrate support 14 and the setting value of the flow rate of the nitrogen-containing gas may be determined by using a correlation. The correlation is the correlation among the width W1 of the bottom of the recess OP1, the temperature of the substrate support 14, and the flow rate of the nitrogen-containing gas.

In step ST2, other etching parameters may be additionally set. For example, the operator inputs a setting value of each etching parameter to the controller 80 of the plasma processing apparatus 1. Other etching parameters include the flow rate of each gas included in the processing gas (excluding the flow rate of the nitrogen-containing gas), the pressure of the gas in the chamber 10, and the first radio-frequency power and/or the second radio-frequency power. The pressure of the gas in the chamber 10 may be set to 10 mTorr (1.3 Pa) or more and 100 mTorr (13.3 Pa) or less. The level of the first radio-frequency power may be set to 1 kW or less. The level of the second radio-frequency power may be set to 1 kW or less. The etching of step ST5 is performed using the set value of each etching parameter set in step ST2.

The method MT1 may include step ST6 which is performed after step ST5. In step ST6, as illustrated in FIG. 4C, the film UR included in the substrate W is etched using the silicon-containing film SF in which the recess OP1 is formed. Since the film UR is etched using the silicon-containing film SF as a mask, a recess OP3 that corresponds to the recess OP1 of the silicon-containing film SF is formed in the film UR. The width W3 of the recess OP3 is substantially the same as the width W1 of the recess OP1. The film UR may be etched at a temperature lower than the volatilization temperature of the by-product BP (e.g., 100° C. or lower).

According to the method MT1, the adhesion amount of the by-product BP adhering to the side wall of the recess OP3 may be adjusted by changing the setting value of the etching parameter PTF. As a result, the width W1 of the bottom of the recess OP1 may also be adjusted. For example, when the temperature of the substrate support 14 is increased, the volatilization of the by-product BP is accelerated, so that the adhesion amount of the by-product BP decreases. As a result, the width W1 of the bottom of the recess OP1 is widened. Meanwhile, when the temperature of the substrate support 14 is decreased, the volatilization of the by-product BP is suppressed, so that the adhesion amount of the by-product BP increases. As a result, the width W1 of the bottom of the recess OP1 is narrowed. Further, in a case where the processing gas includes the nitrogen-containing gas, the adhesion amount of the by-product BP increases when the flow rate of the nitrogen-containing gas is increased, since the by-product BP contains nitrogen. As a result, the width W1 of the bottom of the recess OP1 is narrowed. Meanwhile, when the flow rate of the nitrogen-containing gas is decreased, the adhesion amount of the by-product BP decreases. As a result, the width W1 of the bottom of the recess OP1 is widened. Thus, according to the method MT1, in the plasma etching of the silicon-containing film SF, the width W1 of the bottom of the recess OP1 formed by the etching may be adjusted. Accordingly, the recess OP1 with the bottom having the desired width W1 may be formed.

In step ST6, when the film UR is etched at a temperature lower than the volatilization temperature of the by-product BP, the volatilization of the by-product BP adhering to the side wall that defines the recess OP1 of the silicon-containing film SF may be suppressed. Thus, in step ST6, the width W1 of the bottom of the recess OP1 of the silicon-containing film SF is hard to change, so that the width W3 of the recess OP3 formed in the film UR is also hard to change.

Figure 5:
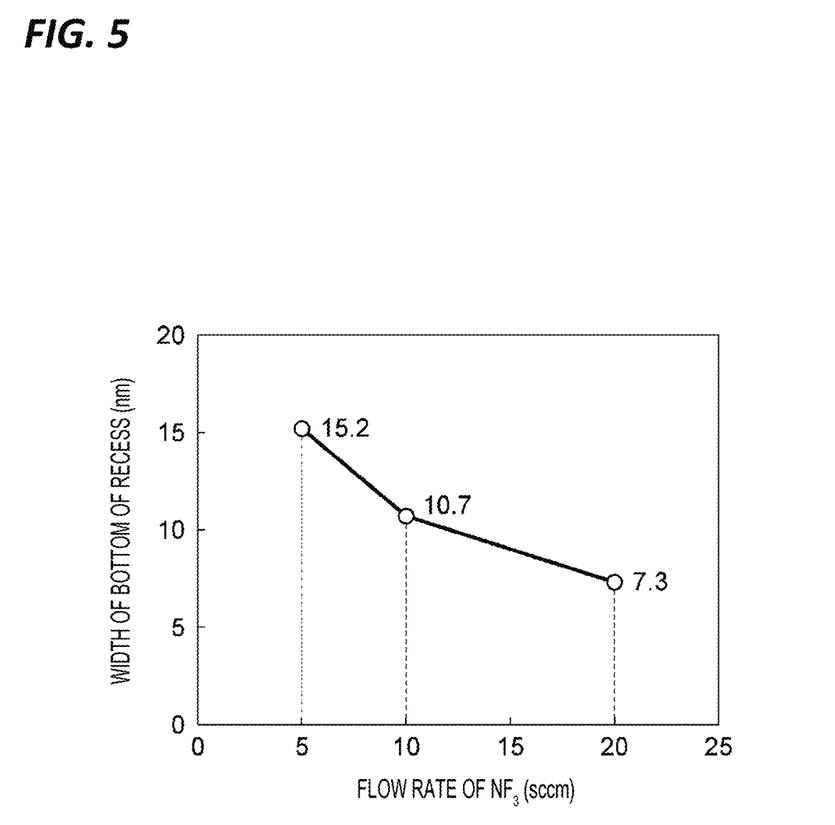
FIG. 5 is a graph illustrating an example of a correlation between a flow rate of $NF_3$ gas in a processing gas and a width of the bottom of a recess formed in a silicon-containing film.

FIG. 5 is a graph illustrating an example of the correlation between the flow rate of the $NF_3$ gas in the processing gas and the width of the bottom of the recess formed in the silicon-containing film. In the example of FIG. 5, when the flow rate of the $NF_3$ gas is 5 sccm, the width W1 of the bottom of the recess OP1 is 15.2 nm. When the flow rate of the $NF_3$ gas is 10 sccm, the width W1 of the bottom of the recess OP1 is 10.7 nm. When the flow rate of the $NF_3$ gas is 20 sccm, the width W1 of the bottom of the recess OP1 is 7.3 nm. In this way, as the flow rate of the $NF_3$ gas in the processing gas increases, the width W1 of the bottom of the recess OP1 formed in the silicon-containing film SF monotonically decreases. In this example, the recess OP1 is a trench that has a line shape, the width W2 of the opening OP2 of the mask MK is about 26 nm to about 27 nm, and the temperature of the substrate support 14 is −40° C.

Figure 6:
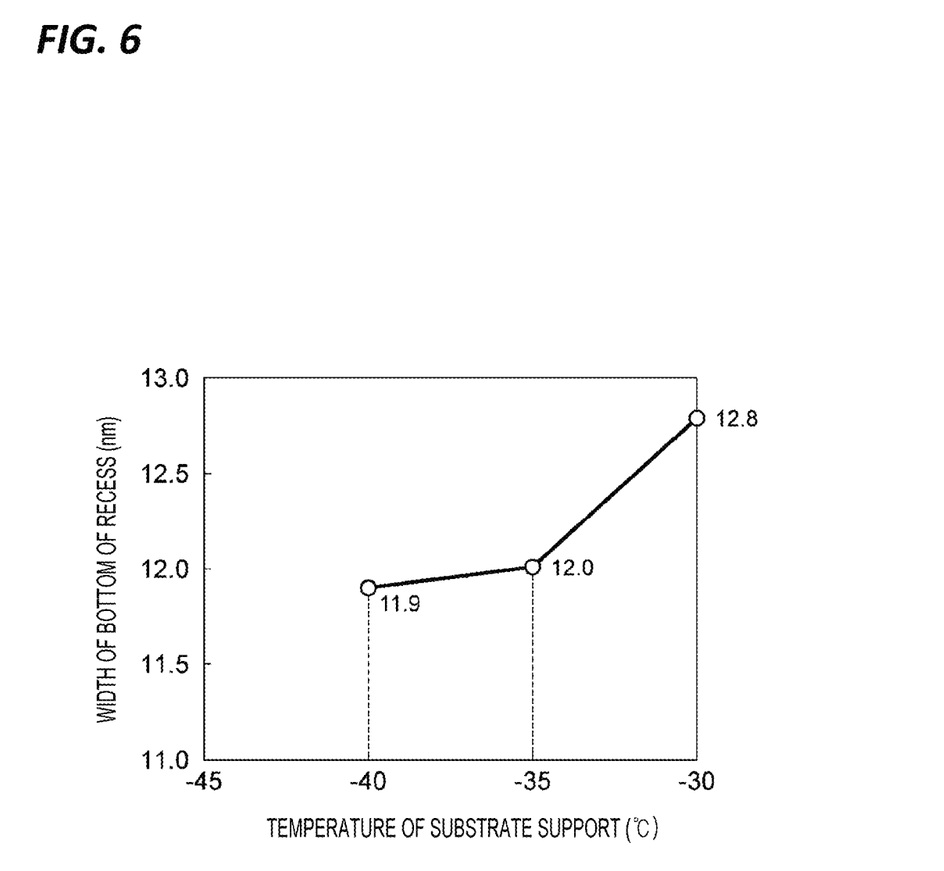
FIG. 6 is a graph illustrating an example of a correlation between a temperature of a substrate support and a width of the bottom of the recess formed in the silicon-containing film.

FIG. 6 is a graph illustrating an example of the correlation between the temperature of the substrate support and the width of the bottom of the recess formed in the silicon-containing film. In the example of FIG. 6, when the temperature of the substrate support 14 is −40° C., the width W1 of the bottom of the recess OP1 is 11.9 nm. When the temperature of the substrate support 14 is −35° C., the width W1 of the bottom of the recess OP1 is 12.0 nm. When the temperature of the substrate support 14 is −30° C., the width W1 of the bottom of the recess OP1 is 12.8 nm. In this way, as the temperature of the substrate support 14 increases, the width W1 of the bottom of the recess OP1 formed in the silicon-containing film SF monotonically increases. In this example, the recess OP1 is a hole, the width W2 of the opening OP2 of the mask MK is about 26 nm to about 27 nm, and the flow rate of the $NF_3$ gas is 5 sccm to 100 sccm.

Figure 7:
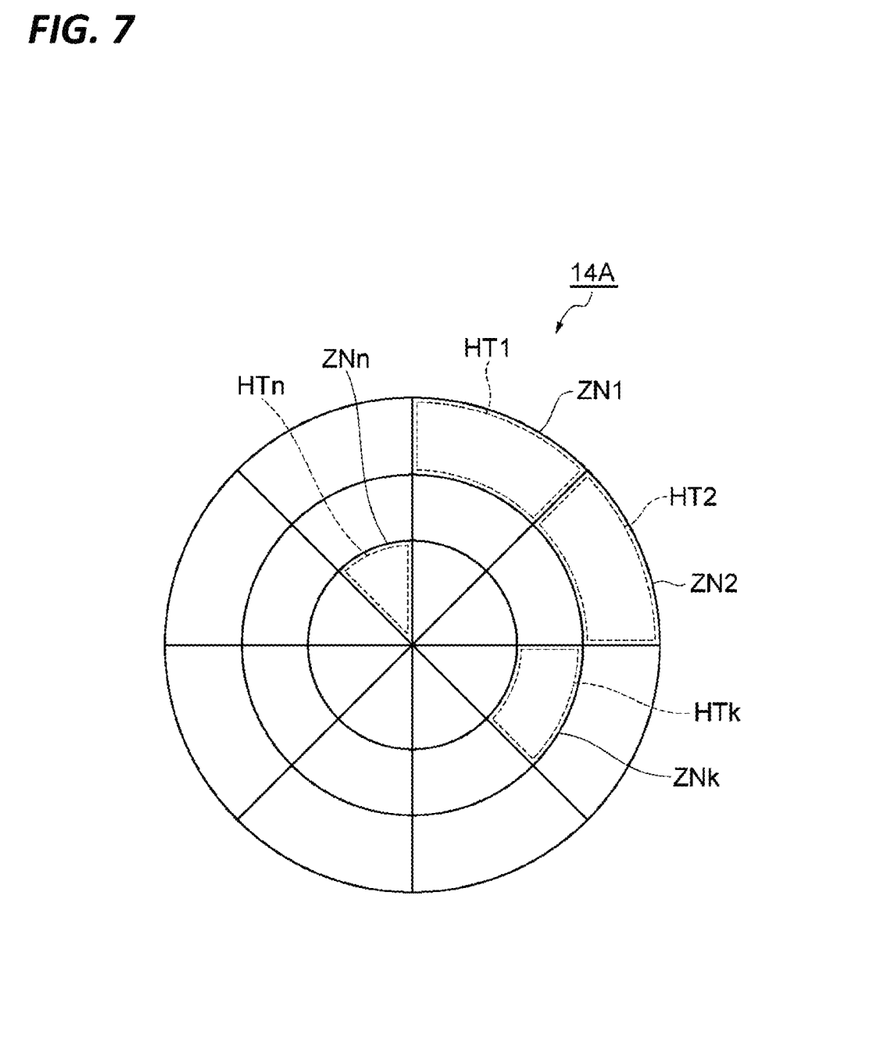
FIG. 7 is a top view illustrating an example of the substrate support.

FIG. 7 is a top view illustrating an example of the substrate support. A substrate support 14A illustrated in FIG. 7 may be used in place of the substrate support 14 of FIG. 2. The substrate support 14A has the same configuration as that of the substrate support 14, except that the substrate support 14A includes a plurality of regions ZN1, ZN2, . . . , and ZNn. The "n" is an integer of 2 or more. The plurality of regions ZN1 to ZNn may be heated to different temperatures. The plurality of regions ZN1 to ZNn may include a plurality of heaters HT1, HT2, . . . , and HTn, respectively. Each heater HTk is embedded in a corresponding region ZNk. The "k" is an integer of 1 or more and "n" or less. An AC power is supplied to each heater HTk so that the substrate support 14A may be heated around the region ZNk. By adjusting the temperature of each region ZNk, the temperature of the region of the substrate W that corresponds to each region ZNk may be adjusted. Thus, according to the substrate support 14A, the width W1 of the bottom of the recess OP1 formed in the silicon-containing film SF may be formed to be different for each region of the substrate W.

Figure 8:
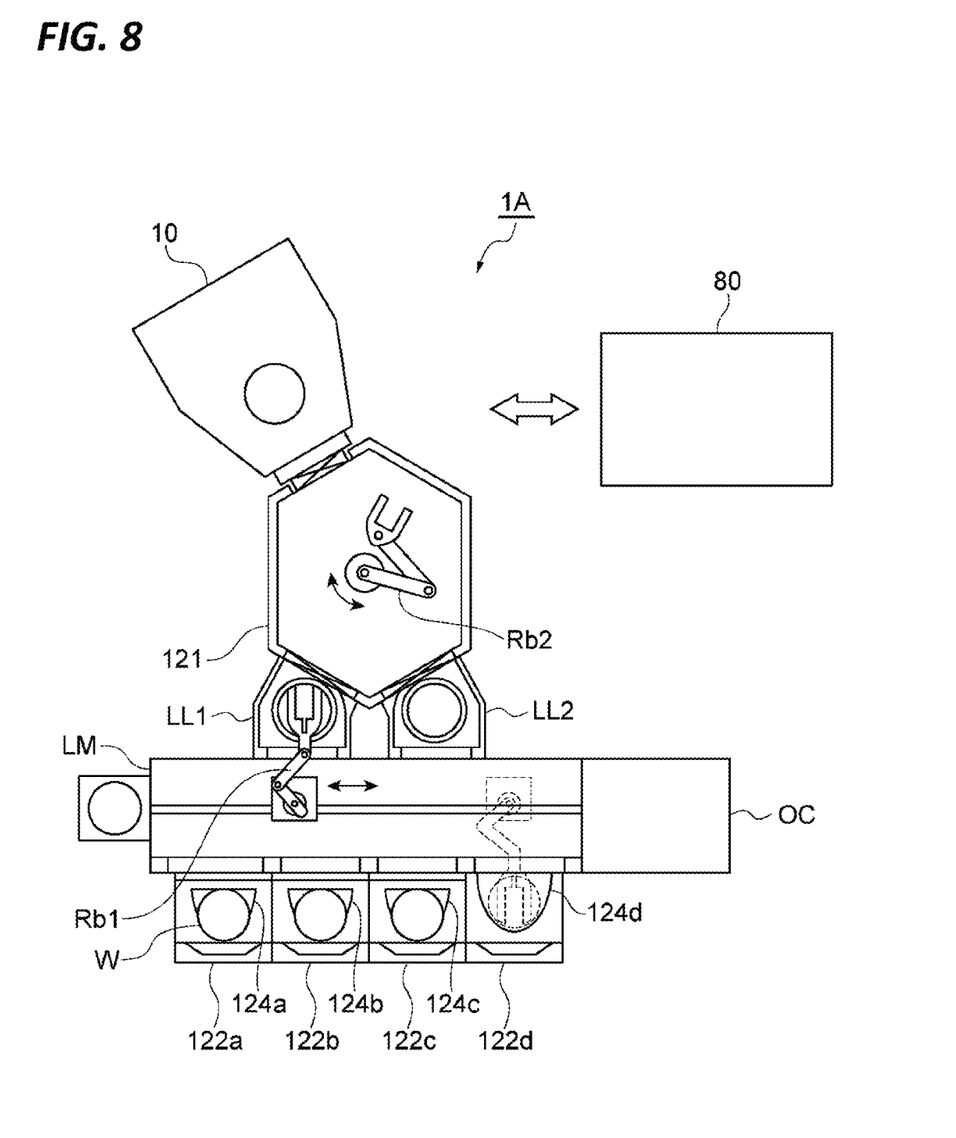
FIG. 8 is a view schematically illustrating a plasma processing apparatus according to another embodiment.

FIG. 8 is a view schematically illustrating a plasma processing apparatus according to another embodiment. A plasma processing apparatus 1A illustrated in FIG. 8 may further include tables 122a, 122b, 122c, and 122d, and containers 124a, 124b, 124c, and 124d, in addition to the plasma processing apparatus 1 of FIG. 2. The plasma processing apparatus 1A may further include a loader module LM, load lock modules LL1 and LL2, a transfer module 121, and an observation device OC.

The tables 122a to 122d are arranged along one edge of the loader module LM. The containers 124a to 124d are provided on the tables 122a to 122d, respectively. The substrate W may be accommodated in each of the containers 124a to 124d. Each of the containers 124a to 124d is, for example, a container called a front-opening unified pod (FOUP).

The loader module LM provides a chamber. A transfer robot Rb1 is provided in the chamber of the loader module LM. The transfer robot Rb1 is configured to transfer the substrate W between any of the containers 124a to 124d and a preliminary decompression chamber of any of the load lock modules LL1 and LL2. The transfer robot Rb1 is configured to transfer the substrate W between the preliminary decompression chamber of any of the load lock modules and the observation device OC. The transfer robot Rb1 is configured to transfer the substrate W between the observation device OC and any of the containers 124a to 124d.

The load lock modules LL1 and LL2 are provided along the other edge of the loader module LM, and connected to the loader module LM. Each of the load lock modules LL1 and LL2 provides a preliminary decompression chamber. Each of the load lock modules LL1 and LL2 is connected to the transfer module 121.

The transfer module 121 provides a decompressable chamber. A transfer robot Rb2 is provided in the chamber of the transfer module 121. A chamber 10 is connected to the transfer module 121. The transfer robot Rb2 is configured to transfer the substrate W between the preliminary decompression chamber of any of the load lock modules LL1 and LL2 and the internal space 10s.

The observation device OC observes the substrate W. The observation device OC may be provided outside the chamber 10. The observation device OC may be an optical observation device or an ultrasonic observation device. The substrate W is movable between the observation device OC and the chamber 10 by the transfer robots Rb1 and Rb2. After the substrate W is accommodated in the observation device OC by the transfer robot Rb1, and the positioning of the substrate W in the observation device OC is performed, the observation device OC observes the recess OP1 of the silicon-containing film SF. The observation device OC may observe the shape of the recess OP1 to measure the width W1 of the recess OP1. The observation device OC may observe the opening OP2 of the mask MK. In this case, the observation device OC may observe the shape of the opening OP2 to measure the width W2 of the opening OP2. The observation device OC measures each of the plurality of regions of the substrate W, and transmits the measured values to the controller 80. The controller 80 controls each unit of the plasma processing apparatus 1A.

Figure 9:
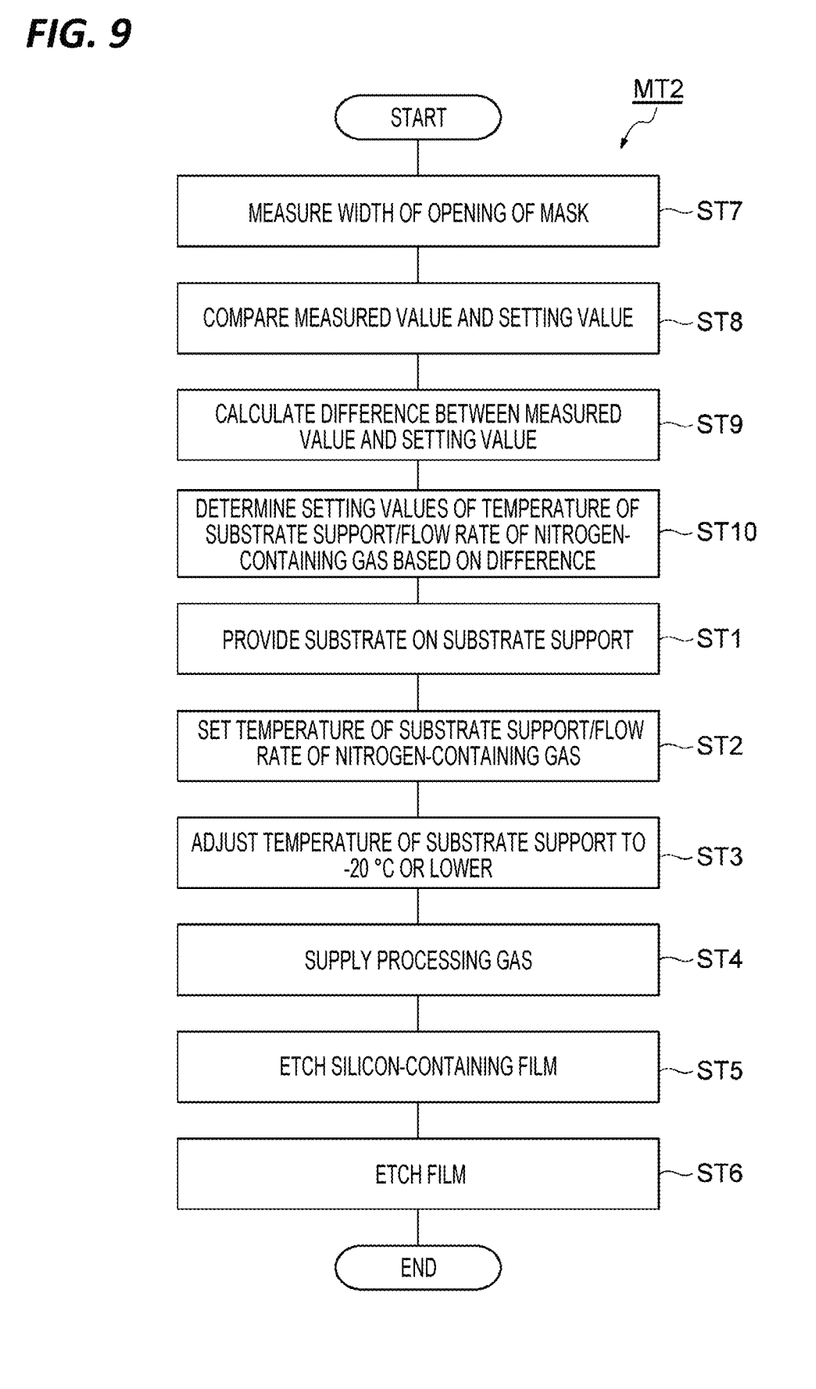
FIG. 9 is a flowchart of an etching method according to another embodiment.

FIG. 9 is a flowchart of an etching method according to another embodiment. The etching method illustrated in FIG. 9 (hereinafter, referred to as a "method MT2") may be executed by the plasma processing apparatus 1A of FIG. 8. The method MT2 is applied to the substrate W. The method MT2 includes steps ST7 to ST10, in addition to steps ST1 to ST6. Steps ST7 to ST10 are executed in this order prior to step ST1. Step ST10 may be executed simultaneously with step ST1, may be executed after step ST1, or may be executed simultaneously with step ST2. Steps ST1 to ST6 are the same as those of the method MT1 of FIG. 3.

In step ST7, the width W2 of the opening OP2 of the mask MK is measured. The width W2 of the opening OP2 may be measured by the observation device OC.

In step ST8, the measured value obtained in step ST7 is compared with the setting value of the width W2 of the opening OP2 of the mask MK. Step ST8 may be executed by the controller 80.

In step ST9, when the measured value obtained in step ST7 exceeds the setting value of the width W2 of the opening OP2 of the mask MK, the difference between the measured value and the setting value is calculated. Step ST9 may be executed by the controller 80.

In step ST10, the setting value of the etching parameter PTF is determined based on the difference calculated in step ST9. As the width W2 of the opening OP2 increases, the width W1 of the bottom of the recess OP1 also increases. Step ST10 may be executed by the controller 80.

According to the method MT2, the width W1 of the bottom of the recess OP1 may be made close to the target value.

While the various embodiments of the present disclosure have been described, various additions, omissions, substitutions, and changes may be made without being limited to the embodiments. Further, components of different embodiments may be combined with each other to form another embodiment.

For example, the plasma processing apparatus used in the methods MT1 and MT2 may be a capacitively coupled plasma processing apparatus, other than the plasma processing apparatus 1. Alternatively, the plasma processing apparatus may be an inductively coupled plasma processing apparatus or an electron cyclotron resonance (ECR) plasma processing apparatus. Alternatively, the plasma processing apparatus may be, for example, a plasma processing apparatus that generates plasma using a surface wave such as a microwave.

Further, the plasma processing apparatus may include a DC power supply configured to intermittently or periodically apply a negative DC voltage pulse to the lower electrode 18, in place of or in addition to the second radio-frequency power supply 64.

According to an embodiment of the present disclosure, in a plasma etching of a silicon-containing film, the width of the bottom of a recess formed by the etching may be adjusted.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising:
   (a) providing a substrate including a silicon-containing film on a substrate support in a chamber of a plasma processing apparatus;
   (b) adjusting a temperature of the substrate support to −20° C. or lower;
   (c) supplying a processing gas including a nitrogen-containing gas, into the chamber;
   (d) etching the silicon-containing film by using plasma generated from the processing gas, so that a recess is formed, and a by-product containing silicon and nitrogen adheres to a side wall of the recess; and
   (e) before (b), setting at least one etching parameter of the temperature of the substrate support and a flow rate of the nitrogen-containing gas included in the processing gas, to adjust a width of a bottom of the recess according to an adhesion amount of the by-product.

2. The etching method according to claim 1, wherein a setting value of the at least one etching parameter is determined by using a correlation between the width of the bottom of the recess and the at least one etching parameter.

3. The etching method according to claim 2, wherein a setting value of the temperature of the substrate support is determined by using the correlation.

4. The etching method according to claim 2, wherein a setting value of the flow rate of the nitrogen-containing gas is determined by using the correlation.

5. The etching method according to claim 1, further comprising:
(f) etching a film included in the substrate by using the silicon-containing film in which the recess is formed.

6. The etching method according to claim 5, wherein in (f), the film is etched at a temperature lower than a volatilization temperature of the by-product.

7. The etching method according to claim 5, wherein in (f), the film is etched at a temperature equal to or lower than 100° C.

8. The etching method according to claim 1, wherein the substrate further includes a mask having an opening, on the silicon-containing film, and
the etching method further comprises:
(g) measuring an opening width of the mask before (a);
(h) comparing a measured value of the opening width of the mask with a setting value of the opening width of the mask;
(i) when the measured value exceeds the setting value, calculating a difference between the measured value and the setting value; and
(j) determining a setting value of the at least one etching parameter based on the difference.

9. The etching method according to claim 1, wherein the silicon-containing film is an antireflection film.

10. The etching method according to claim 1, wherein an aspect ratio of the recess is 5 or less.

11. The etching method according to claim 1, wherein the nitrogen-containing gas includes at least one of $N_2$, $NF_3$, and $NH_3$.

12. The etching method according to claim 1, wherein the processing gas includes carbon and fluorine.

13. The etching method according to claim 12, wherein the processing gas includes at least one of a gas mixture of hydrocarbon gas and a fluorine-containing gas, fluorocarbon gas, and hydrofluorocarbon gas.

14. The etching method according to claim 1, wherein in (e), a pressure of the chamber is set to 10 mTorr or more and 100 mTorr or less.

15. The etching method according to claim 1, wherein the substrate includes a mask provided with an opening on the silicon-containing film and made of an organic material or a metal-containing material.

16. The etching method according to claim 1, wherein the processing gas includes at least one of $H_2$, hydrogen fluoride (HF), hydrocarbon, hydrofluorocarbon, and $NH_3$ as hydrogen containing molecules.

17. An etching method comprising:
(a) providing a substrate including a film containing silicon and nitrogen on a substrate support in a chamber of a plasma processing apparatus;
(b) adjusting a temperature of the substrate support to −20° C. or lower;
(c) supplying a processing gas including hydrogen and fluorine, into the chamber;
(d) etching the film containing silicon and nitrogen by using plasma generated from the processing gas, so that a recess is formed, and a by-product containing silicon and nitrogen adheres to a side wall of the recess; and
(e) before (b), setting the temperature of the substrate support to adjust a width of a bottom of the recess according to an adhesion amount of the by-product.

* * * * *